US010411718B2

(12) United States Patent
Nagarajan et al.

(10) Patent No.: US 10,411,718 B2
(45) Date of Patent: Sep. 10, 2019

(54) PHASE-LOCKED LOOP OUTPUT ADJUSTMENT

(71) Applicant: QUALCOMM Incorporated, San Diego, CA (US)

(72) Inventors: Karthik Nagarajan, Santa Clara, CA (US); Chenling Huang, Fremont, CA (US); Debesh Bhatta, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 171 days.

(21) Appl. No.: 15/714,372

(22) Filed: Sep. 25, 2017

(65) Prior Publication Data

US 2019/0097640 A1 Mar. 28, 2019

(51) Int. Cl.
| | |
|---|---|
| *H03L 7/06* | (2006.01) |
| *H03L 7/093* | (2006.01) |
| *H03L 7/089* | (2006.01) |
| *H03K 5/26* | (2006.01) |
| *H03K 5/1252* | (2006.01) |
| *H03L 7/07* | (2006.01) |
| *H03L 7/087* | (2006.01) |
| *H03L 7/22* | (2006.01) |
| *H03L 7/23* | (2006.01) |
| *H03K 5/00* | (2006.01) |

(52) U.S. Cl.
CPC ............ *H03L 7/093* (2013.01); *H03K 5/1252* (2013.01); *H03K 5/26* (2013.01); *H03L 7/07* (2013.01); *H03L 7/087* (2013.01); *H03L 7/0891* (2013.01); *H03L 7/22* (2013.01); *H03L 7/235* (2013.01); *H03K 2005/00013* (2013.01)

(58) Field of Classification Search
CPC ..... H03L 7/093; H03L 7/0891; H03K 5/1252; H03K 5/26; H03K 2005/00013
USPC .......................................................... 327/157
See application file for complete search history.

(56) References Cited

U.S. PATENT DOCUMENTS

| | | | |
|---|---|---|---|
| 5,699,387 A | 12/1997 | Seto et al. | |
| 7,023,251 B2 | 4/2006 | Starr | |
| 7,271,666 B1 | 9/2007 | Melanson | |
| 8,258,877 B2 | 9/2012 | Goel et al. | |
| 9,660,797 B2* | 5/2017 | Zhu | H03L 7/085 |
| 2008/0116946 A1* | 5/2008 | Masson | H03L 7/0812 |
| | | | 327/149 |
| 2013/0342377 A1* | 12/2013 | Lin | H03M 1/48 |
| | | | 341/143 |

OTHER PUBLICATIONS

Chen X., et al., "A Fast Locking All-Digital Phase-Locked Loop via Feed-Forward Compensation Technique", IEEE Transactions on Very Large Scale Integration (VLSI) Systems, May 2011, vol. 19, No. 5, pp. 857-868.

\* cited by examiner

*Primary Examiner* — Metasebia T Retebo
(74) *Attorney, Agent, or Firm* — Paradice and Li LLP/Qualcomm

(57) ABSTRACT

A method and apparatus for reducing the amount of jitter in a signal are disclosed. In one embodiment a feed-forward loop compares the edges of a reference clock and an input signal, converts a time difference of the compared edges into a voltage signal, and controls a time delay in a voltage controlled delay line in order to reduce or eliminate jitter.

26 Claims, 6 Drawing Sheets

PHASE-LOCKED LOOP OUTPUT ADJUSTMENT

BACKGROUND

Aspects of the present disclosure relate generally to telecommunications, and more particularly, to phase-locked loops.

In telecommunications, it is desirable to synchronize the phase of an incoming signal with the phase of a reference clock. This is commonly achieved through use of a variable frequency oscillator (VFO), which may for example include a voltage controlled oscillator (VCO) and a phase-locked loop. The VCO may serve as the reference clock and be variable over a wide band of frequencies. The phase-locked loop may serve as the device that synchronizes the incoming signal's phase with the phase of the VCO. Phase noise, however, may be present in both signals, which may cause an undesirable phase-noise jitter in the output of the device. Phase noise may refer to frequency domain representation of random fluctuations in the phase of a waveform. Jitter may reduce the reliability and/or data rates of telecommunication circuits.

It is desirable to implement methods and/or devices to improve VCO and/or phase-locked loop performance, for example for use in a telecommunication circuit.

SUMMARY

The disclosure is directed to a feed-forward loop, for example that may reduce or eliminate the time interval error (TIE) (i.e., jitter) of a signal. The feed-forward loop is disclosed as a circuit for ease of explanation. However, it is to be appreciated that the feed-forward loop may have alternative configurations or implementations. For example, the feed-forward loop may be implemented as software or with different configurations of the specific components.

The feed-forward loop is described with a phase locked loop for ease of demonstration. In alternative embodiments, the feed-forward loop may be used with any circuit output that it is desirable to reduce the low frequency jitter of. A phase locked loop (PLL) circuit includes an input from a reference clock, a source, and an output. The phase locked loop generate a clock at a higher frequency than the reference clock. Such output clock may be N*FREF, where N is the multiplying factor and FREF is frequency of reference clock. A VCO (voltage controlled oscillator) may be used to generate the high frequency output. A divider circuit may divide the PLL output down to a reference frequency rate. Imperfections (or jitter) may be added to the output by these elements, for example the generation of the high frequency output by the VCO. Traditional methods (e.g., using a known PLL loop) of reducing jitter (e.g., due to (phase) noise) may be insufficient, for example in intermediate frequencies.

Generally, the feed-forward circuit receives the output from the PLL circuit and outputs the same signal with a time delay. Specifically, a divider circuit may receive the output from the PLL circuit and divide the output of the PLL down to a reference rate. A phase frequency detector (PFD) may receive the output of the PLL (which may comprise a plurality of discrete time signals) from the divider circuit and a reference clock signal. In some embodiments, the reference clock signal may be produced from a voltage controlled oscillator (VCO). The PFD detects a time difference between the edges of the reference clock and the output of the PLL circuit (i.e., the PLL output in discrete segments).

The PFD may output a representative signal on either an UP line or a DOWN line depending on which signal's edge is leading. The PFD may comprise a means for comparing an edge of a first clock signal with an edge of a second clock signal and outputting a time difference between the edges. In alternative embodiments, the means for comparing an edge of a first clock signal with an edge of a second clock signal and outputting a time difference between the edges may be any circuit, software, or combination thereof capable of doing so.

A time to voltage conversion circuit is connected to the UP and DOWN lines and receives the representative signal. The time to voltage conversion circuit is configured to change a voltage on a voltage line an amount proportional to the time difference. The time to voltage conversion circuit may include a charge pump connected to the phase frequency detector, a switched capacitor circuit connected to the charge pump, a bias circuit, and an amplifier circuit. The bias circuit creates a bias voltage for the circuit based on the threshold voltages of a bias PMOS transistor and a NMOS bias transistor. The time to voltage conversion circuit may comprise a means for changing a voltage signal a proportional amount to the time difference of the compared edges. It is to be appreciated that there are a variety of circuit and software configurations that may act as a time to voltage conversation circuit and those configurations are within the scope of this disclosure.

A voltage controlled delay line is connected to the voltage line and the output of the PLL circuit. The voltage controlled delay line delays the output of the PLL circuit an amount of time based on the magnitude of the voltage received from the time to voltage conversion circuit. The voltage controlled delay line may comprise a means to convert the voltage signal back into a time delay signal. The voltage controlled delay line may be implemented in many different configurations.

In operation, the feed-forward loop may compare an edge of a first clock signal with an edge of an output signal from a phase locked loop and detect a time difference between the edge of the first clock signal and the edge of the output signal. The amount of time between the edges may be output as a representative signal that is equal in time to the time difference. The feed-forward loop converts the time difference to a change in a voltage, which controls the amount of time delay on the output signal of the phase locked loop based on the voltage. The resulting output from the feed-forward loop is a time delayed PLL output that may have less time interval error (i.e., jitter) than the non-time delayed PLL output.

Certain methods described herein may improve the phase-noise performance of a phase-locked loop in a telecommunication circuit, without a trade-off on other critical performance parameters.

BRIEF DESCRIPTION OF THE DRAWINGS

The accompanying drawings, which are incorporated herein and constitute part of this specification, illustrate examples described in the disclosure, and together with the general description given above and the detailed description given below, serve to explain the features of the various implementations.

Like reference numbers and designations in the various drawings indicate like elements.

DETAILED DESCRIPTION

Various implementations will be described in detail with reference to the accompanying drawings. Wherever possible, the same reference numbers may be used throughout the drawings to refer to the same or like parts. Different reference numbers may be used to refer to different, same, or similar parts. References made to particular examples and implementations are for illustrative purposes, and are not intended to limit the scope of the disclosure or the claims.

It should be understood that implementations of the present disclosure may be used in a variety of applications. Although the present disclosure is not limited in this respect, the circuits disclosed herein may be used in many apparatuses such as in the transmitters and receivers of a radio system. Radio systems intended to be included within the scope of the present disclosure include, by way of example only, cellular radiotelephone communication systems, satellite communication systems, two-way radio communication systems, one-way pagers, two-way pagers, personal communication systems (PCS), personal digital assistants (PDA's), internet of things (IoT) devices, medical devices, and the like.

Figure 1:
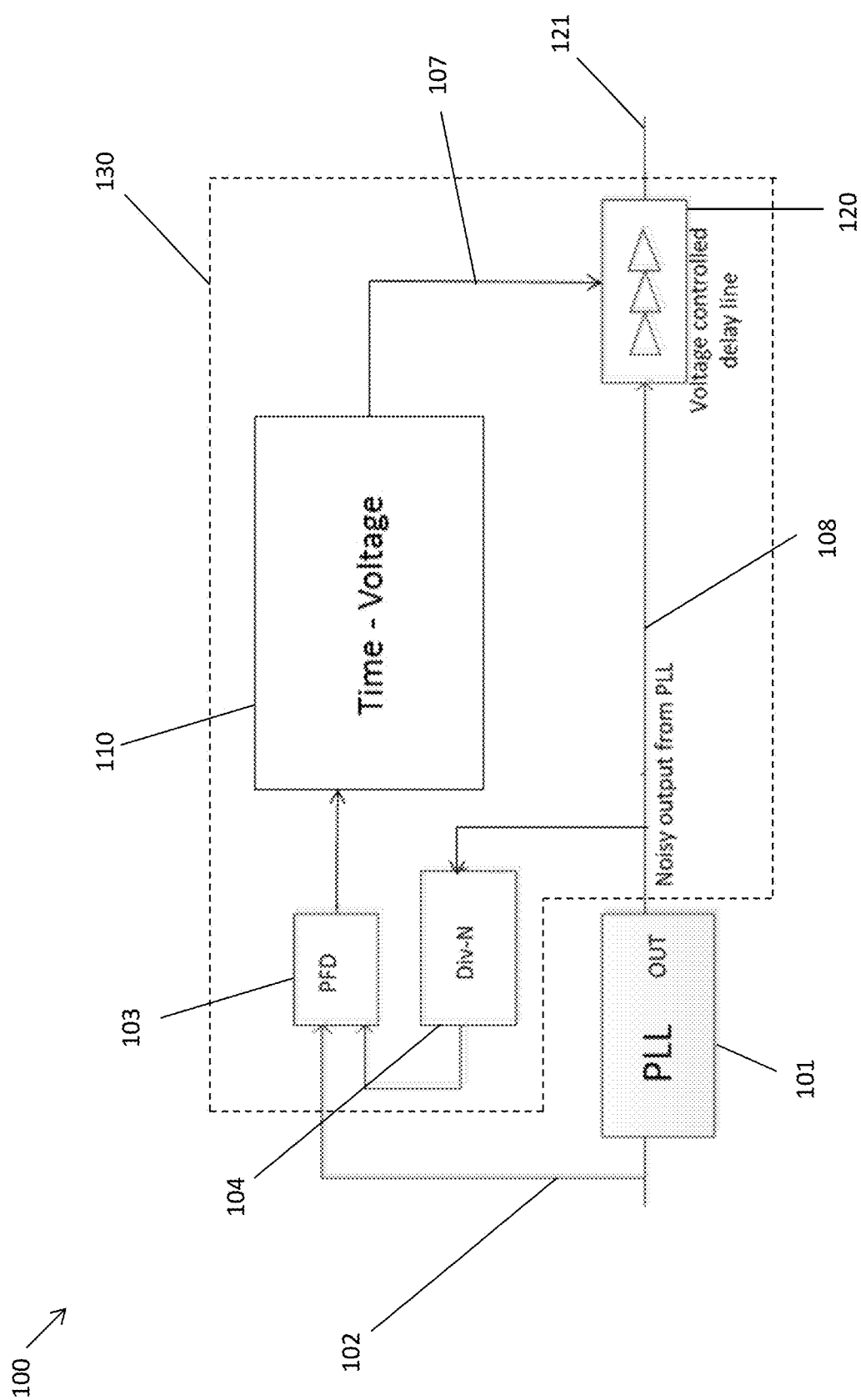
FIG. 1 depicts a circuit diagram of a phase-locked loop and a feed-forward loop in accordance with an illustrative embodiment.

Types of cellular radiotelephone communication systems intended to be within the scope of the present disclosure include, but are not limited to, Frequency Division Multiple Access (FDMA) systems, Time Division Multiple Access (TDMA) systems, Extended-TDMA (E-TDMA) cellular radiotelephone systems, Global System for Mobile Communications (GSM) systems, Code Division Multiple Access (CDMA) systems (particularly, Evolution-Data Optimized (EVDO) systems), CDMA-2000 systems, Universal Mobile Telecommunications Systems (UMTS) (particularly, Wideband Code Division Multiple Access (WCDMA), Long Term Evolution (LTE) systems, Single Radio LTE (SRLTE) systems, Simultaneous GSM and LTE (SGLTE) systems, 5G systems, High-Speed Downlink Packet Access (HSDPA) systems, and the like), Code Division Multiple Access 1× Radio Transmission Technology (1×) systems, General Packet Radio Service (GPRS) systems, Wi-Fi systems, Bluetooth systems, Near-Field Communication systems, Personal Communications Service (PCS) systems, and other protocols that may be used in a wireless communications network or a data communications network FIG. 1 is a circuit diagram 100 of a phase-locked loop 101 and a feed-forward loop 130 in accordance with an illustrative embodiment. The phase-locked loop 101 may be implemented in any structure known within the art. For example, the phase-locked loop (PLL) 101 may be implemented as an analog PLL, linear PLL, digital PLL, software PLL, a Neuronal PLL, or a combination thereof. A reference clock 102 is connected to the input of the phase-locked loop 101.

The feed-forward loop 130 is connected to an output 108 of the phase-locked loop 101 and has a cleaned output line 121. The feed-forward loop 130 may include a time difference circuit coupled to the reference clock 102 and the output 108 of the PLL 101. The time difference circuit may, for example, include a divider circuit 104 and a phase frequency detector (PFD) 103, or other circuitry configured to (or means for) output a signal representative of a time difference between the reference clock 102 and the output 108 of the PLL 101.

The feed-forward loop 130 may further include a time to voltage conversion circuit 110 coupled to an output of the time difference circuit (e.g., to an output of the PFD 103), and a voltage controlled delay line 120. The divider circuit 104 may be coupled to the output 108 of the phase-locked loop 101 and the phase frequency detector 103. The divider circuit 104 divides its input (e.g., the output 108 of the PLL 101) into multiple discrete segments. In various embodiments, the number and length of the discrete segments will vary depending upon the input frequency.

The phase frequency detector 103 is further coupled to the reference clock 102 and has an output coupled to the time to voltage conversion circuit 110. The phase frequency detector 103 compares the discrete segments of the PLL output signal with the reference clock 102 and outputs a signal based upon the comparison. Specifically, the phase frequency detector 103 compares the time difference between the edges of the reference clock 102 and the edges of the PLL-output (i.e., discrete segments) and outputs a representative signal. The representative signal is equal in time to the time difference between the compared edges. In certain embodiments, one or more elements of the feed-forward loop 130 (for example the time to voltage conversion circuit 110 and/or the circuits 103 and 104) may be implemented as a delta-T to delta-V circuit, for example configured to convert the difference in time between the reference clock 102 and PLL output (at 108) to a voltage or voltage change.

In an embodiment, the reference clock 102 is implemented as voltage-controlled oscillator (VCO) The reference clock may instead be provided by a relatively clean source, for example a crystal oscillator (XO). In alternative embodiments, the reference clock 102 may be any device known in the art.

A voltage line 107 connects the output of the time to voltage conversion circuit 110 (for example, the output of the delta-T to delta-V circuit) to the voltage controlled delay line 120. The voltage controlled delay line 120 is further coupled to the output 108 of the phase-locked loop 101 and coupled to the cleaned output line 121. The voltage controlled delay line 120 delays its input (i.e., the output 108 of the PLL) a set amount of time based on a voltage on the voltage line 107. In other words, the cleaned output 121 carries a time delayed signal of the PLL output 108. As stated above, the amount of time delay in the voltage controlled delay line is based on the voltage on the voltage line 107. In certain embodiments, the voltage controlled delay line 120 may be implemented as a delta-V to delta-T circuit, for example configured to convert a change in voltage on the voltage line 107 to a time change between the lines 108 and 121.

Figure 2:
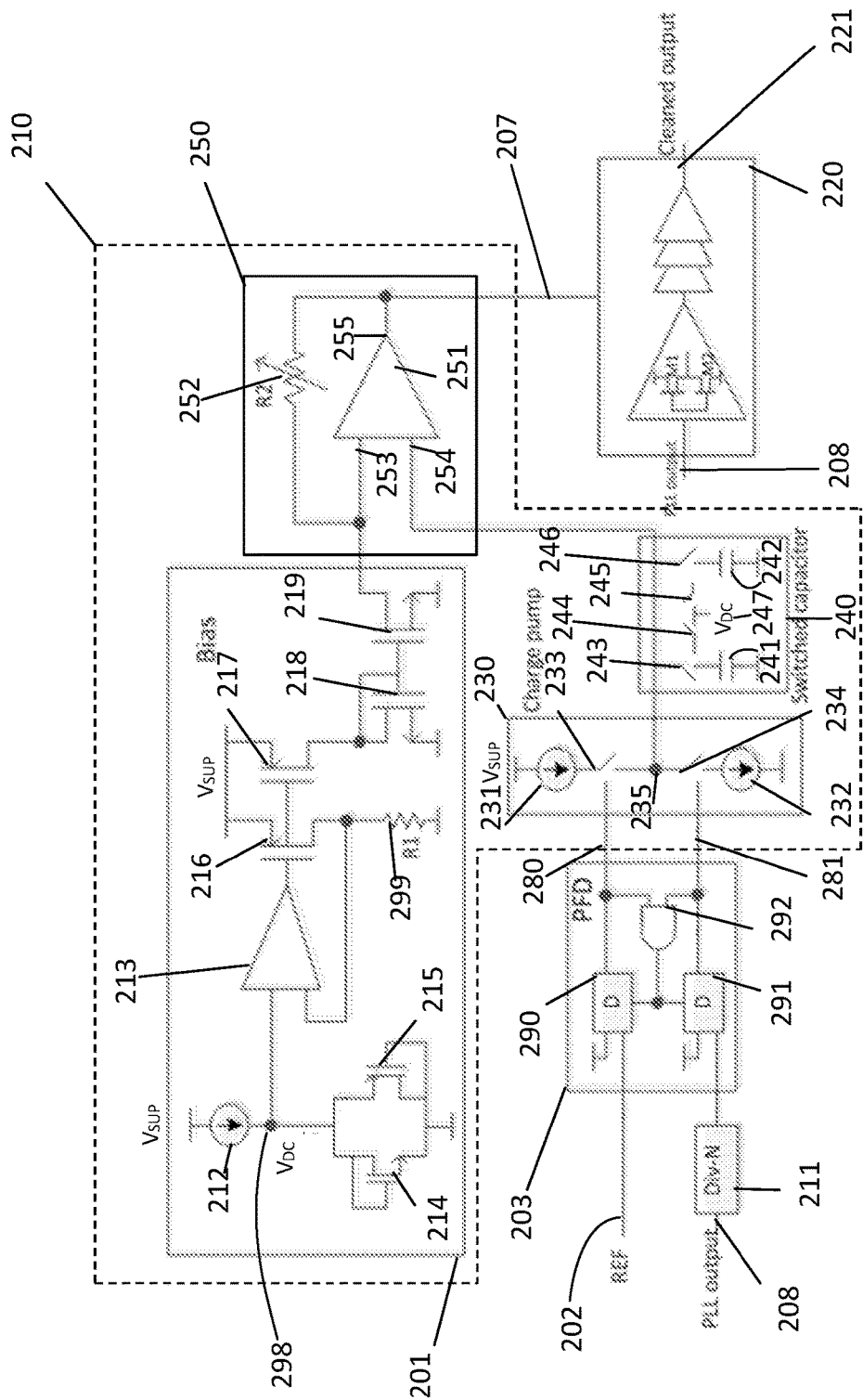
FIG. 2 depicts a circuit diagram of a feed-forward loop in accordance with an illustrative embodiment.

FIG. 2 depicts a circuit diagram of a feed-forward loop 200 in accordance with an illustrative embodiment. Specifically, the feed-forward loop 200 includes a divider circuit 211, a phase frequency detector (PFD) 203, a time to voltage conversion circuit 210, and a voltage controlled delay line 220. The divider circuit 211 is connected to an output 208 of a PLL and to the phase frequency detector 203. The phase frequency detector 203 is further connected to a reference clock 202 and has two outputs 280 and 281 connected to the time to voltage conversion circuit 210. The time to voltage conversion circuit 210 is further connected to the voltage controlled delay line 220 via a voltage line 207. The voltage controlled delay line 220 is further connected to the output 208 of the PLL and to a cleaned output line 221.

The divider circuit 211 divides its input (e.g., the output of a phase-locked loop) into a plurality of discrete segments. The plurality of discrete segments are then outputted into the phase frequency detector 203 to be compared with a reference clock 202. The divider circuit 211 may be implemented in any number of different ways. In one embodiment, a ripple counter divider is used.

The phase frequency detector 203 is depicted as a solid-state machine. Specifically, the solid state machine uses two D-type flip-flops 290 and 291 and an AND gate 292. The first D-type flip-flop 290 is connected to the reference clock 202, a power supply (i.e., a logical "1"), an output of the AND gate 292, and an UP output line 280. The second D-type flip-flop 291 is connected in a similar configuration to the output of the divider circuit 211, a power supply (i.e., a logical "1"), the output of the AND gate 292, and a DOWN output line 281. Further, the UP output line 280 and the DOWN output 281 are connected to a first and a second input, respectively, on the AND gate 292, and an output of the AND gate is connected to a reset pin on the D-type flip-flops 290 and 291. The UP output line 280 and the DOWN output line 281 are also connected to the time to voltage conversion circuit 210. It is to be appreciated that there are many phase frequency detector configurations known in the art. In alternative embodiments, the phase frequency detector 203 may be any circuit that compares the phase of a reference clock and an input signal and outputs a result proportional to the differences thereof.

The time to voltage conversion circuit 210 includes a charge pump 230, a switched capacitor 240, a bias circuit 201, and an amplifying circuit 250. The charge pump 230 is connected to the UP and DOWN output lines 280 and 281 and the switched capacitor 240. The switched capacitor 240 is further connected to the amplifying circuit 250. The amplifying circuit 250 is also connected to the bias circuit 201 and the voltage controlled delay line 220.

The charge pump 230 includes a first constant current source 231, a second constant current source 232, a first switch 233, and a second switch 234. The first constant current source 231 is connected to a power supply and the first switch 233. The first switch 233 is further connected to the UP output line 280 and a central node 235. The central node 235 is also connected to the switched capacitor 240 and the second switch 234. The second switch 234 is connected to the DOWN output line 281 and the second constant current source 232. The second constant current source 232 is connected to a second voltage. The UP output line 280 activates the first switch 233 when it carries a high voltage, and the DOWN output line 281 activates the second switch 234 when it carries a high voltage. The charge pump 230 is a bipolar switched current source that outputs positive and negative current pulses. It is to be appreciated that there are many charge pump configurations known in the art. In alternative embodiments, the charge pump 230 may be any configuration which outputs current pulses based on the input.

As stated above, the switched capacitor 240 is connected to the central node 235. The switched capacitor 240 includes a first switch 243, a second switch 244, a third switch 245, a fourth switch 246, a first capacitor 241, a second capacitor 242, and a voltage source 247. The first switch 243 is connected to the central node 235, the second switch 244, and the first capacitor 241. The fourth switch 246 is connected to the central node 235, the third switch 245, and the second capacitor 242. The voltage source 247 is connected to the second and third switches 244 and 245. The first and second capacitors 241 and 242 are connected to a relative ground (i.e., a second voltage). The switched capacitor 240 is a discrete-time signal processor that integrates the input (e.g., the current pulses). In some embodiments, the switched capacitor 240 may integrate signals over a number of clock cycles. In other embodiments, the switched capacitor 240 may be reset to a bias voltage $V_{DC}$ every clock cycle. The voltage source 247 is a bias voltage $V_{DC}$ that is connected to the bias circuit 201. It is to be appreciated that there are many switched capacitor configurations known in the art. In alternative embodiments, the switched capacitor 240 may be any other configuration that is capable of integrating an incoming signal.

The amplifying circuit 250 includes an operational amplifier 251 and a variable resistor 252. A positive input 254 of the operational amplifier 251 is connected to the switched capacitor 240. An output 255 of the operational amplifier 251 is connected to the voltage line 207 and the variable resistor 252. The variable resistor 252 is further connected to a negative input 253 of the operational amplifier 251. It is to be appreciated that there are many amplifier configurations known in the art. In alternative embodiments, the amplifying circuit 250 may be a differential amplifier, a non-inverting amplifier, or an inverting amplifier. Furthermore, the amplifying circuit 250 may include different components. For example, the amplifying circuit 250 may include capacitors, transistors, operational amplifiers, or a combination thereof.

The negative input 253 of the operational amplifier 251 is also connected to the bias circuit 201. The bias circuit 201 includes a current source 212, a bias NMOS transistor 214, a bias PMOS transistor 215, a bias operational amplifier 213, a first transistor 216, a second transistor 217, a third transistor 218, a fourth transistor 219, and a resistor 299. The current source 212 is connected to a voltage supply $V_{SUP}$ and to the drain of the bias NMOS transistor 214 and the source of the bias PMOS transistor 215. The bias NMOS transistor 214 and the bias PMOS transistor 215 are connected in parallel and their respective gates are connected to their respective drains. This configuration allows for a DC voltage $V_{DC}$ to be biased based on the threshold voltages of the bias NMOS transistor 214 and the bias PMOS transistor 215. This biasing allows for the circuit to be robust while operating in a range of temperatures.

The negative input of the bias operational amplifier 213 is connected to a node 298 that is located between the current source 212 and the transistors 214, 215. The output of the bias operational amplifier 213 is connected to the gate of the first transistor 216 and the bulk connection of the first transistor 216 is connected to the gate of the second transistor 217. In an embodiment, the first and the second transistors 216 and 217 are PMOS transistors. The source of the first transistor 216 is connected to the voltage supply $V_{SUP}$ and the drain of the first transistor 216 is connected to the resistor 299. The first transistor 216 is set in a common drain configuration, where the output of the common drain configuration is connected to the positive input of the bias operational amplifier 213. In other words, the node between the first transistor 216 and the resistor 299 is connected to the positive input of the bias operational amplifier 213.

The second transistor 217 is connected to the voltage supply $V_{SUP}$ and to the third transistor 218. That is, the source of the second transistor 217 is connected to $V_{SUP}$, and the drain of the second transistor 217 is connected to the drain of the third transistor 218. In an embodiment, the third and fourth transistors 218 and 219 are NMOS transistors. Further, the sources of the third and fourth transistors 218 and 219 are connected to ground, and the gates of the third transistor 218 and the fourth transistor 219 are coupled together and to the source of the third transistor 218. The drain of the fourth transistor 219 is the output of the bias circuit 201. In other words, the drain of the fourth transistor 219 is connected to the negative input 253 of the operational amplifier 251.

The output of the amplifying circuit 250 inputs into the voltage controlled delay line 220. The voltage controlled delay line 220 includes one or more inverters and a calibration circuit. For example, the voltage controlled delay line 220 may include a chain of inverters as is generically illustrated in FIG. 2. In other embodiments, any other implementation which can produce a delayed version of an input signal may be utilized.

The output 208 of the PLL is connected to the voltage controlled delay line 220. The voltage on the voltage delay line from the amplifying circuit 250 (i.e., the output of the amplifying circuit 250) controls the time delay between the output 208 of the PLL (i.e., the input to the voltage controlled delay line 220) and the cleaned output 221. The cleaned output 221 is the output of the voltage controlled delay line 220 and carries a time delayed signal that may have less jitter than the output 208 of the PLL.

Figure 3:
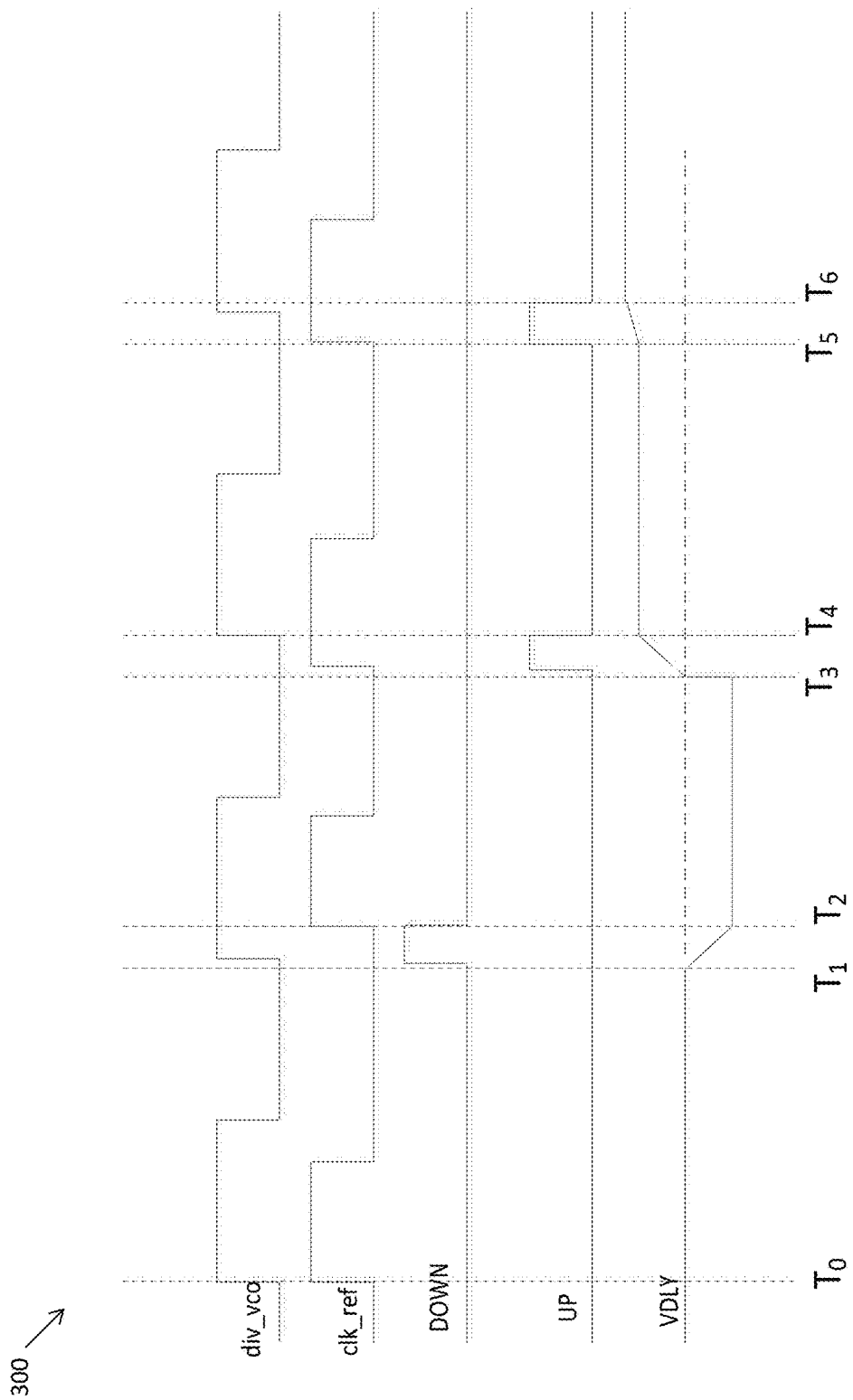
FIG. 3 depicts a timing diagram of a circuit with a feed-forward loop in accordance with an illustrative embodiment.

FIG. 3 depicts an example timing diagram 300 of a circuit with a feed-forward loop in accordance with an illustrative embodiment. The clock reference $CLK_{REF}$, divided output of the PLL $DIV_{VCO}$, outputs of the phase frequency detector UP and DOWN, and voltage on the voltage delay line $V_{DLY}$ are depicted. The circuit begins operating at $T_0$. After the first cycle (i.e., at $T_1$), the feed-forward loop detects the phase difference between $CLK_{REF}$ and $DIV_{VCO}$. For example, the phase frequency detector 203 (or PFD 103) compares the rising edges of the reference and divided signals (e.g., the time between $T_1$ and $T_2$), and that time difference is captured on either the UP line 280 or the DOWN line 281. The UP line 280 will have a signal if the rising edge of the $CLK_{REF}$ is leading (i.e., before in time) the rising edge $DIV_{VCO}$, and the DOWN line 281 will have a signal if the rising edge of the $CLK_{REF}$ is lagging (i.e., later in time) the rising edge $DIV_{VCO}$. In the example illustrated in FIG. 3 the time between $T_1$ and $T_2$ is the time that the rising edge of the $CLK_{REF}$ is lagging (i.e., later in time) the rising edge $DIV_{VCO}$. Thus the DOWN line 281 carries a signal during the interval between $T_1$ and $T_2$. The signal on the DOWN line is then converted by the time to voltage conversion circuit 110, 210. That is, the DOWN signal translates to a decrease in the magnitude of the voltage signal $V_{DLY}$ on the voltage line 107, 207. The magnitude that the voltage signal $V_{DLY}$ decreases may be proportional to the time difference between the rising edges of $CLK_{REF}$ and $DIV_{VCO}$ (e.g., the time difference between $T_1$ and $T_2$).

After $T_2$, a full cycle of $CLK_{REF}$ and $DIV_{VCO}$ occurs in the illustrated example and at $T_3$ the difference in the rising edges of $CLK_{REF}$ and $DIV_{VCO}$ are again detected and compared (e.g., by the PFD 103, 203). The rising edge of the $CLK_{REF}$ occurs at $T_3$ and the rising edge of $DIV_{VCO}$ occurs at $T_4$. Thus the rising edge of $CLK_{REF}$ is leading (i.e., before in time) the rising edge $DIV_{VCO}$ and an UP signal is captured during the time in between $T_3$ and $T_4$. The signal on the UP line is then converted by the time to voltage conversion circuit 110, 210. That is, the UP signal translates to a rise in the magnitude of the voltage signal $V_{DLY}$ on the voltage line 107, 207. The magnitude that the voltage signal $V_{DLY}$ rises may be proportional to the time difference between the rising edges of $CLK_{REF}$ and $DIV_{VCO}$ (e.g., the time difference between $T_3$ and $T_4$). In the illustrated embodiment, the change in $V_{DLY}$ is not only positive in reference to the signal at $T_2/T_3$, but is positive with respect to a neutral or base level, for example as existed at $T_0$. In other embodiments, the rise in $V_{DLY}$ may be only with respect to the previous value of $V_{DLY}$ irrespective of an original or neutral value.

After $T_4$ another full cycle $CLK_{REF}$ and $DIV_{VCO}$ may occur and the process may be repeated. For example, a rising edge of the $CLK_{REF}$ may occurs at $T_5$ and a rising edge of $DIV_{VCO}$ may occurs at $T_6$, as is further illustrated in FIG. 3. This may cause an UP signal between $T_5$ and $T_6$ and may cause $V_{DLY}$ to further rise.

As discussed above, the voltage signal $V_{DLY}$ on the voltage delay line (i.e., the output of the time to voltage conversion circuit) controls the amount of time delay in the voltage controlled delay line 120, 220. Thus, by comparing the rising edges of $CLK_{REF}$ and $DIV_{VCO}$ and delaying the output 208 of the PLL, the time interval error (TIE) can be corrected, for example after every cycle, and/or the jitter of the PLL signal can be reduced.

Figure 4:
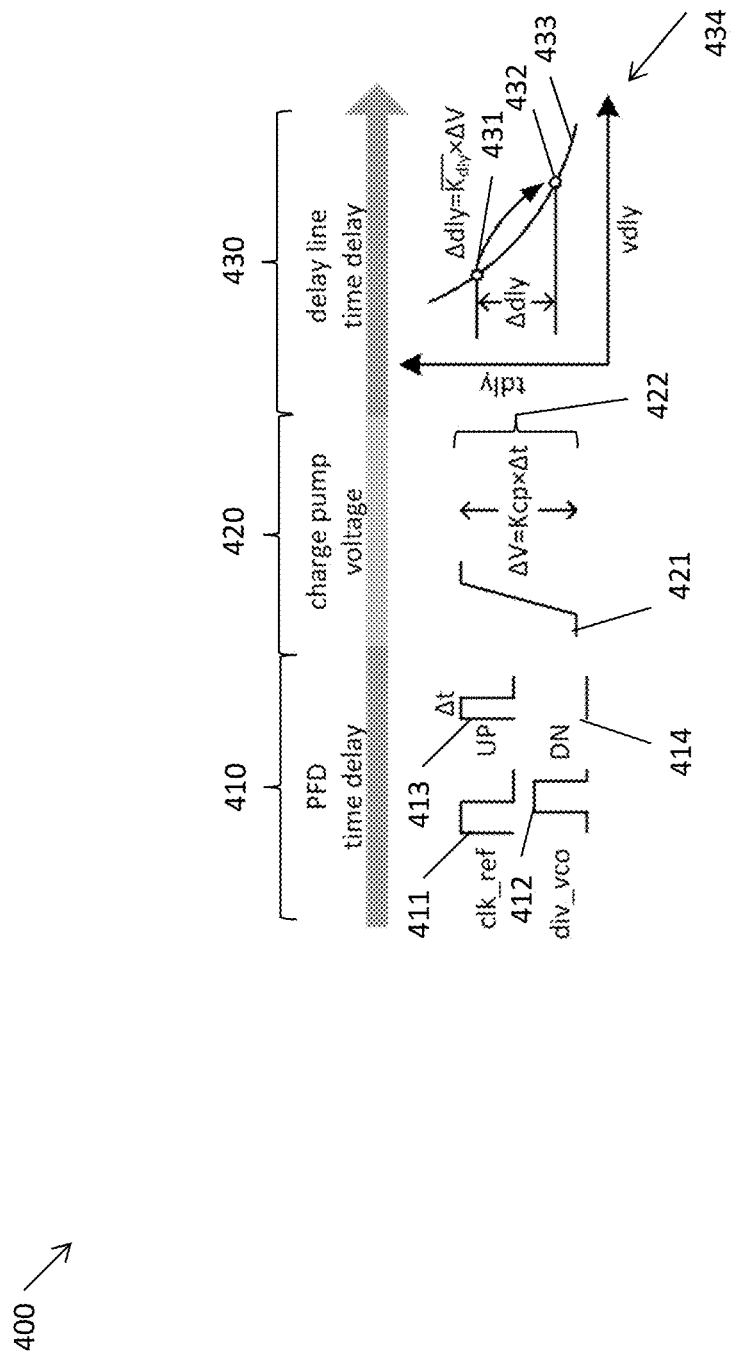
FIG. 4 depicts an operation of a phase-locked loop and a feed-forward loop in accordance with an illustrative embodiment.

FIG. 4 depicts an operation 400 of a phase-locked loop and a feedforward loop in accordance with an illustrative embodiment. A first part 410 depicts a comparison of the rising edges of $CLK_{REF}$ and $DIV_{VCO}$ and a resulting output from the comparison. In the first part 410, a rising edge 411 of the $CLK_{REF}$ signal is leading (i.e., before in time) than a rising edge 412 of the $DIV_{VCO}$ signal. As a result, a time length Δt equal to the difference in time between the rising edges of $CLK_{REF}$ and $DIV_{VCO}$ is outputted as an UP signal 413. A DOWN signal 414 is unaffected in this example.

A second part 420 depicts a change in a voltage signal 421 (e.g., $V_{DLY}$) in response to the UP signal 413. The UP signal 413 causes the voltage signal 421 (e.g., $V_{DLY}$) to rise by a magnitude ΔV proportional to the time length Δt 422. In a third part 430, the time of delay in the voltage controlled delay line is changed. In a graph 434, the y-axis depicts a time delay $T_{DLY}$ (e.g., the time delay in the voltage controlled delay line) that is dependent upon the voltage signal 421 (e.g., $V_{DLY}$ is depicted on the x-axis). A line 433 in the graph 434 depicts a characteristic of the voltage controlled delay line (i.e., the typical behavior for a given voltage controlled delay cell). A first dot 431 depicts the time delay before the circuit creates an UP signal 413, and a second dot 432 depicts the time delay after the voltage signal 421 (e.g., $V_{DLY}$) increases by the magnitude ΔV. A change $\Delta T_{DLY}$ of the time delay $T_{DLY}$ is roughly proportional to the magnitude ΔV in this example.

While examples above are described with respect to comparison of rising edges, embodiments which compare falling edges and/or a combination of rising and falling edges are within the scope of this disclosure and one having skill in the art will understand how to implement such embodiments based on the disclosure herein.

Figure 5:
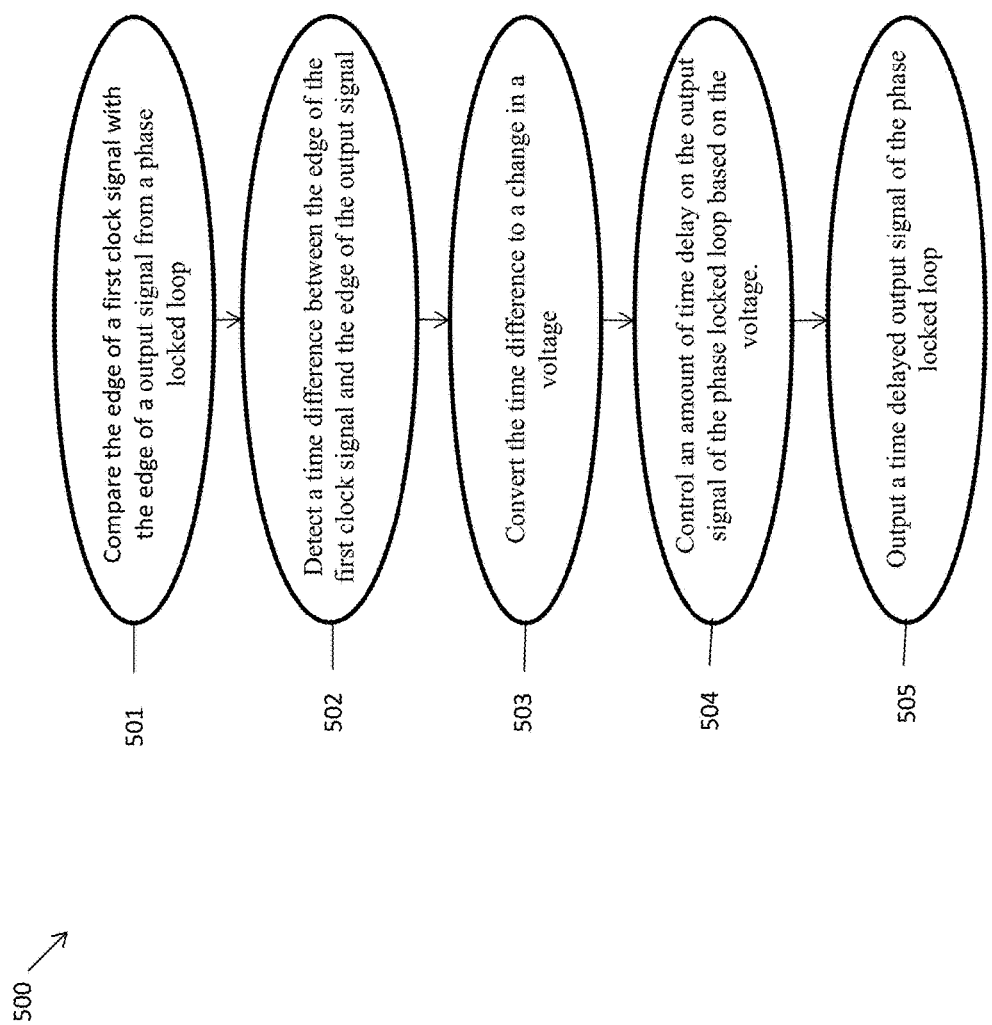
FIG. 5 is a flow diagram depicting a method of operation for a feed-forward loop in accordance with an illustrative embodiment.

FIG. 5 is flow diagram depicting a method of operation 500, for example for a feed-forward loop in accordance with an illustrative embodiment. The method of operation 500 controls the amount of delay on an output signal. Controlling delay in this way may reduce or eliminate jitter in an output signal from a PLL in certain embodiments. Below, Table 1 illustrates simulation results using this method.

In an operation 501, the edge (rising and/or falling) of a first clock signal is compared with the edge (rising and/or falling) of an output signal from a phase locked loop.

Operation 501 may be performed, for example, by the feed forward loop 130, 200 or elements thereof (e.g., divider circuit 104, 211 and/or PFD 103, 203) In an operation 502, a time difference between the edge of the first clock signal and the edge of the phase-locked loop output signal is detected, for example by the feed forward loop 130, 200 or elements thereof (e.g., divider circuit 104, 211 and/or PFD 103, 203). In an embodiment, the first clock signal may be a reference clock or a VCO signal. Further, a representative signal of the time difference between the edge of the first clock signal and the edge of the phase-locked loop output signal may be created, for example by the PFD 103, 203. The representative signal may be produced in many different forms. For example, the representative signal may be produced by the PFD 203 on an UP line if the first signal's edge is leading (i.e., before in time) the output from the PLL. Alternatively, the PFD 203 or other element in the feed-forward loop may produce the representative signal on a DOWN line if the first signal's edge is lagging (i.e., after in time) the output from the PLL. In alternative embodiments, other correlations may be made and the feed-forward loop or elements thereof may produce any representative signal that is based upon a difference in edges of the first clock signal and the phase-locked loop output signal.

In an operation 503, the time difference is converted to a change in a voltage, for example by the time to voltage conversion circuit 110, 210 or other elements in the feed forward loop 130, 200. In an example embodiment, the representative signal on an UP line of a phase frequency detector may cause the output voltage to increase, and the representative signal on a DOWN line of the phase frequency detector may cause the output voltage to decrease (or vice versa). In an embodiment, the magnitude of change in the output voltage is proportional to the time difference. In alternative embodiments, the magnitude of change in output voltage may be proportional to a magnitude or time length of the representative signal.

In an operation 504, one or more elements of the feed-forward loop controls an amount of time delay on the output signal of the phase locked loop based on the voltage (e.g., the time to voltage circuit 110, 210 may control the amount of voltage on the line 107, 207 to control the voltage controlled delay line 120, 220). For example, the feed-forward loop may convert output voltage back to a time delay. The magnitude of the output voltage may determine the amount of time delay in a voltage controlled delay line.

An input of the voltage controlled delay line (e.g., voltage controlled delay line 120, 220) is an output of the phase-locked loop (PLL) and the output of the voltage controlled delay line is a time delayed signal of the PLL output. In an embodiment, a lower output voltage (e.g., $V_{DLY}$) may increase the amount of time delay in the voltage controlled delay line, and a higher output voltage (e.g., $V_{DLY}$) may decrease the amount of time delay in the voltage controlled delay line (or vice versa). In an operation 505, a time delayed output signal of the phase locked loop is output. The output signal may, for example have an improved time interval error (TIE).

TABLE 1

Jitter before and after feed-forward TIE correction.

| model | temp | in_jitter | out_jitter |
|---|---|---|---|
| tt | −30 | 391.729 | 85.902 |
| tt | 55 | 391.515 | 80.773 |

TABLE 1-continued

Jitter before and after feed-forward TIE correction.

| model | temp | in_jitter | out_jitter |
|---|---|---|---|
| tt | 125 | 391.581 | 65.098 |
| ss | −30 | 392.5 | 68.837 |
| ss | 55 | 392.195 | 68.141 |
| ss | 125 | 392.039 | 59.239 |
| ff | −30 | 391.56 | 94.932 |
| ff | 55 | 391.39 | 97.179 |
| ff | 125 | 391.355 | 89.137 |
| sf | −30 | 392.146 | 69.246 |
| sf | 55 | 391.963 | 60.831 |
| sf | 125 | 391.929 | 64.378 |
| fs | −30 | 391.387 | 107.506 |
| fs | 55 | 391.477 | 104.39 |
| fs | 125 | 391.318 | 104.684 |

Table 1 depicts the results of a voltage and temperature (PVT) dependent simulation of an example feed-forward loop. Specifically, Table 1 demonstrates the difference in jitter of a signal before and after the time interval error (TIE) correction with the feed-forward loop. In the simulation, a noisy clock with large jitter (e.g., a typical PLL output signal) was input into the feed-forward loop. In certain simulations, greater than 3× improvement in jitter was observed.

The first and left-most column depicts the model of the process, voltage, and temperature (PVT) simulation. These models may represent, for example, device models describing typical, slow, or fast corners. The second column depicts the temperature at which the simulation was run. Column three depicts the amount of jitter that an incoming signal had when initially compared to a clock signal. Column four depicts the amount of jitter exhibited by the corrected signal after being outputted from the feed-forward loop (i.e., the TIE correction). The temperature is expressed in units of degrees Celsius and the jitter is expressed in units of picoseconds (Ps). Table 1 shows that the jitter was improved by a factor greater than three when the feed-forward loop was used. This result was consistent across many temperatures and models.

Figure 6:
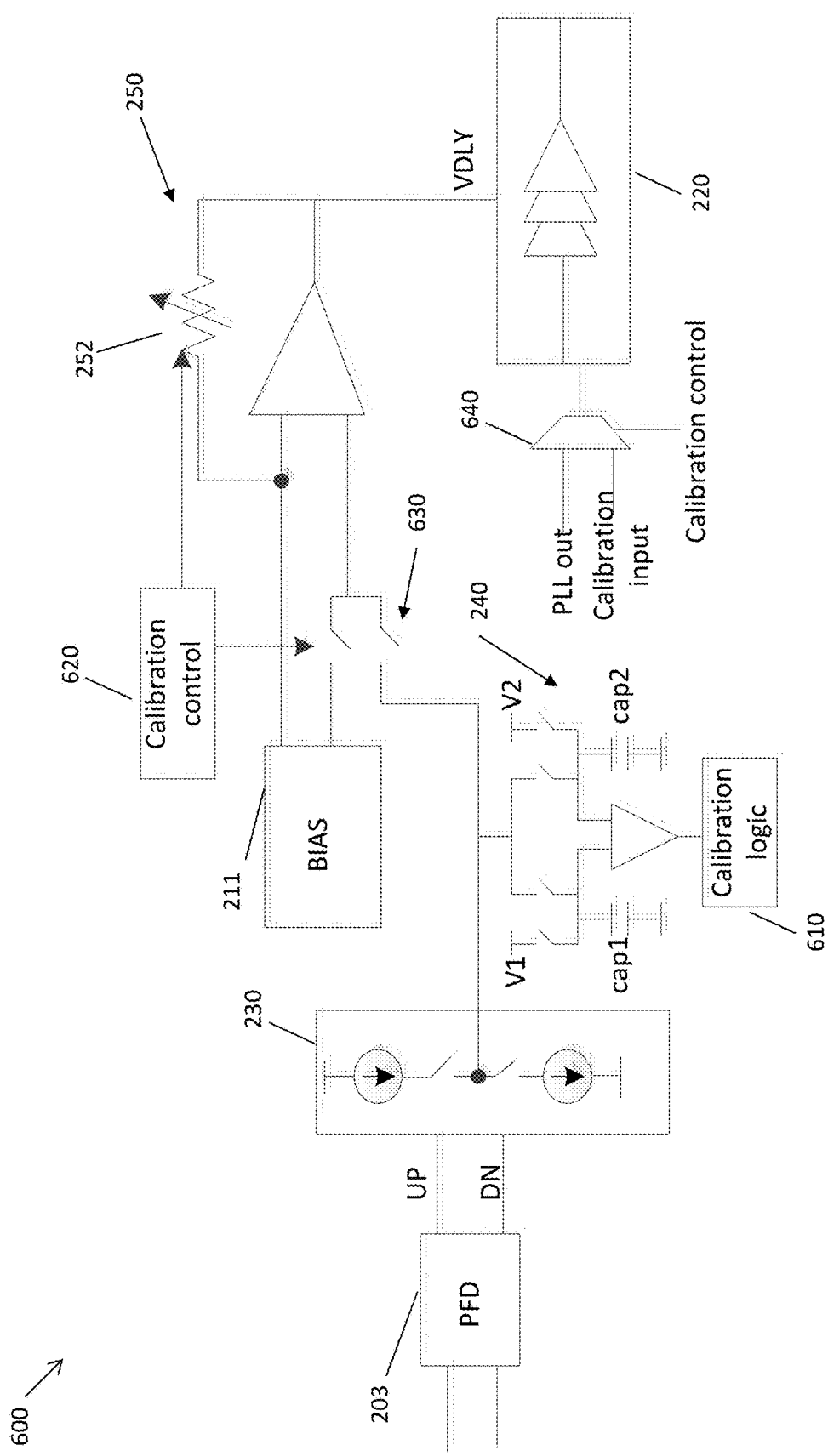
FIG. 6 is a flow diagram depicting elements which may be used for calibrating a feed-forward loop in accordance with an illustrative embodiment.

FIG. 6 is a flow diagram 600 depicting elements which may be used for calibrating a feed-forward loop in accordance with an illustrative embodiment. Certain of the elements illustrated in FIG. 2 are illustrated in FIG. 6. Certain other elements are omitted for simplicity of explanation, but those of skill in the art will understand that these elements may also be implemented in the embodiment illustrated in FIG. 6.

FIG. 6 further illustrates elements which may be used for calibration. In some embodiments, calibration may match the gain of delay line characteristics—change in delay with respect to change in voltage (or kdl) to charge pump output. For example, the calibration may match Δv (from charge pump 230 output) to Δt (from delay line 220). To accomplish this, the delay line 220 supply voltage $V_{DLY}$ may be set to a nominal value. The calibration elements illustrated in FIG. 6 may be used to for this purpose by adjusting the delay line 220 bias voltage in steps. At each of these steps, initial delay through the delay line may be measured through change in voltage at one of the capacitors, for example cap1. Voltage on delay line may then be adjusted, for example by a fixed amount, and a new delay measured through another cap, for example cap2. At the end of this cycle, voltage on cap1 and cap2 is measured to estimate change in delay through the delay line (kdl). If it does not match the required value, delay line bias is adjusted and above steps are repeated. As illustrated in FIG. 6, one or more of the calibration logic 610 (e.g., in combination with the comparator having inputs coupled between the capacitors cap1 and cap2 and having an output coupled to the calibration logic 610) and/or calibration control 620 (e.g., in combination with the switches 630 which may be used to select between the bias 211 and the output of the switched capacitor 240, and/or the adjustable resistor 252). In some embodiments, the calibration control 620 and/or a separate calibration control may be used to select between the PLL output and the calibration input or mux the two together at 640.

The various implementations illustrated and described are provided merely as examples to illustrate various features of the claims. However, features shown and described with respect to any given implementation are not necessarily limited to the associated implementation and may be used or combined with other implementations that are shown and described. Further, the claims are not intended to be limited by any one example implementation.

The foregoing method descriptions and the process flow diagrams are provided merely as illustrative examples and are not intended to require or imply that the steps of various implementations must be performed in the order presented. As will be appreciated by one of skill in the art the order of steps in the foregoing implementations may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the implementations disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the implementations disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In some exemplary implementations, the functions described may be implemented in hardware, software, firmware, or any combination thereof. If implemented in software, the functions may be stored as one or more instructions or code on a non-transitory computer-readable storage medium or non-transitory processor-readable storage medium. The steps of a method or algorithm disclosed herein may be embodied in a processor-executable software module, which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed implementations is provided to enable any person skilled in the art to make or use the present disclosure. Various modifications to these implementations will be readily apparent to those skilled in the art, and the generic principles defined herein may be applied to some implementations without departing from the spirit or scope of the disclosure. Thus, the present disclosure is not intended to be limited to the implementations shown herein but is to be accorded the widest scope consistent with the following claims and the principles and novel features disclosed herein.

What is claimed is:

1. An apparatus comprising:
  a phase locked loop (PLL) circuit;
  a time difference circuit coupled to an input and an output of the PLL circuit, the time difference circuit comprising:
    a divider circuit connected to the output of the PLL circuit and configured to divide the output of the PLL into discrete segments; and
    a phase frequency detector (PFD) connected to the divider circuit, wherein the PFD is configured to detect a time difference between edges of the discrete segments and edges of a reference signal;
    a time to voltage conversion circuit coupled to an output of the time difference circuit; and
  a voltage controlled delay line coupled to the output of the PLL circuit and an output of the time to voltage conversion circuit.

2. The apparatus of claim 1, wherein the time difference circuit, the time to voltage conversion circuit, and the voltage controlled delay line are elements of a feed-forward loop.

3. The apparatus of claim 1, wherein the time to voltage conversion circuit is coupled to the PFD and configured to convert the time difference detected by the PFD to a voltage change, and wherein the voltage controlled delay line is configured to delay the output of the PLL circuit based on the voltage change received from the time to voltage conversion circuit.

4. The apparatus of claim 1, the time to voltage conversion circuit further comprising:
 a charge pump connected to the PFD;
 a switched capacitor circuit connected to the charge pump; and
 a bias circuit configured to output a bias voltage based on threshold voltages of a bias PMOS transistor and a bias NMOS transistor.

5. The apparatus of claim 4, the time to voltage conversion circuit further comprising an amplifier circuit connected to the bias circuit, the switched capacitor circuit, and the voltage controlled delay line, wherein the amplifier circuit further comprises a variable resistor and an operational amplifier.

6. The circuit of claim 5, wherein a positive input of the operational amplifier is connected to the switched capacitor circuit, and a negative input of the operational amplifier is connected to the bias circuit and the variable resistor.

7. The circuit of claim 5, wherein an output of the operational amplifier is connected to the voltage controlled delay line.

8. The circuit of claim 7, wherein an amount of delay in the voltage controlled delay line is based on a magnitude of a voltage output from the amplifier circuit.

9. The circuit of claim 4, the bias circuit further comprising:
 a current source connected to a positive terminal of a bias operational amplifier, a source of the bias PMOS transistor, and a drain of the bias NMOS transistor,
 wherein a gate of the bias PMOS transistor is connected to a drain of the bias PMOS transistor, and a gate of the bias NMOS transistor is connected to a drain of the bias NMOS transistor.

10. The circuit of claim 1, wherein the reference signal comprises a reference clock signal received by the PLL circuit and the PFD.

11. The circuit of claim 1, the voltage controlled delay line further comprising a plurality of inverters coupled in series.

12. A method comprising:
 comparing an edge of a first clock signal with an edge of an output signal from a phase locked loop to detect a time difference between the edge of the first clock signal and the edge of the output signal;
 converting the time difference to a voltage change, the converting comprising:
  creating a bias voltage based on threshold voltages of a bias NMOS transistor and a bias PMOS transistor; and
  altering the bias voltage based on an output of a charge pump to produce the voltage change; and
 controlling an amount of time delay on the output signal of the phase locked loop based on the voltage change.

13. The method of claim 12, further comprising dividing an output of the phase locked loop into a plurality of discrete segments, wherein comparing the edge of the first clock signal with the edge of the output signal from the phase locked loop comprises comparing respective edges of the first clock signal with respective edges of the plurality of discrete segments.

14. The method of claim 12, wherein a magnitude of the voltage change is proportional to a magnitude of the time difference.

15. The method of claim 12, wherein the threshold voltages of the bias NMOS transistor and the bias PMOS transistor are dependent on temperature.

16. The method of claim 15, wherein the controlling the amount of time delay comprises delaying the output of the phase locked loop using a voltage controlled delay line based on the voltage change.

17. The method of claim 12, further comprising resetting an output of the charge pump to the bias voltage after each cycle of comparing the edge of the first clock signal with the edge of the output signal from the phase locked loop.

18. The method of claim 12, wherein the first clock signal comprises a reference clock signal received by both the phase locked loop and a phase frequency detector, wherein the phase frequency detector compares the edge of the first clock signal with the edge of the output signal from the phase locked loop.

19. The method of claim 12, further comprising outputting the time difference between the edge of the first clock signal and the edge of the output signal as a representative signal.

20. The method of claim 19,
 wherein the representative signal is produced on an UP line in response to the edge of the first clock signal leading the edge of the output signal from the phase locked loop; and
 wherein the representative signal is produced on a DOWN line in response to the edge of the first clock signal lagging the edge of the output signal from the phase locked loop.

21. The method of claim 20, wherein the representative signal produced on the DOWN line causes the voltage change to decrease.

22. The method of claim 20, wherein the representative signal produced on the UP line causes the voltage change to increase.

23. The method of claim 19, wherein the representative signal has a time length equal to the time difference between the edge of the first clock signal and the edge of the output signal.

24. The method of claim 12, further comprising outputting a time delayed signal of the output signal.

25. The method of claim 24, wherein the time delayed signal has a reduced time interval error.

26. An apparatus comprising:
 means for comparing an edge of a first clock signal with an edge of a phase-locked loop output signal and outputting a time difference between the edges;
 means for converting the time difference into a change in a voltage signal comprising:
  creating a bias voltage based on threshold voltages of a bias NMOS transistor and a bias PMOS transistor; and
  altering the bias voltage based on an output of a charge pump to produce the voltage signal, wherein the change in the voltage signal is proportional to the time difference; and
 means for delaying the phase-locked loop output signal based on the change in the voltage signal.

* * * * *